(12) United States Patent
Perner et al.

(10) Patent No.: US 6,777,270 B2
(45) Date of Patent: Aug. 17, 2004

(54) RESISTIVE MEMORY FOR DATA STORAGE DEVICES

(75) Inventors: Frederick A. Perner, Palo Alto, CA (US); Andrew L. Van Brocklin, Corvallis, OR (US); Steven C. Johnson, Eagle, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/752,611

(22) Filed: Jan. 7, 2004

(65) Prior Publication Data

US 2004/0140525 A1 Jul. 22, 2004

Related U.S. Application Data

(62) Division of application No. 10/137,475, filed on May 1, 2002, now Pat. No. 6,717,234.

(51) Int. Cl.[7] .............................................. H01L 21/82
(52) U.S. Cl. ...................... 438/131; 438/257; 438/467; 438/600; 438/957; 257/530
(58) Field of Search ................................. 438/131, 130, 438/257, 467, 600, 957; 257/530, 2, 3, 536; 365/159, 158

(56) References Cited

U.S. PATENT DOCUMENTS 6,541,312 B2 * 4/2003 Cleeves et al. ............. 438/131

* cited by examiner

*Primary Examiner*—David Nelms
*Assistant Examiner*—Long Tran (57) ABSTRACT

An exemplar method for making a resistive memory element generally includes providing a generally plateau-shaped insulating structure, the insulating structure having a first side wall, a second side wall and a central region disposed between the side walls, depositing a first conductive material on the insulating structure, removing the first conductive material from the central region of the insulating structure to form a first conductor on the first side wall of the insulating structure and a second conductor on the second side wall of the insulating structure, depositing anti-fuse material on the first conductive material and on the central region of the insulating structure, and depositing a second conductive material on the anti-fuse material.

18 Claims, 10 Drawing Sheets

RESISTIVE MEMORY FOR DATA STORAGE DEVICES

This application is a divisional of U.S. patent application Ser. No. 10/137,475, filed on May 1, 2002, now U.S. Pat. No. 6,717,234.

BACKGROUND

1. Field of the Invention

The invention relates generally to data storage devices, and, more particularly, to resistive memory elements and arrays for data storage devices.

2. Related Art

A resistive memory device is typically characterized by the capability of assuming one of two distinct resistance states at any one time. Data is stored in the device based on the resistance state of the device. Typically, a logic "1" is characterized by a high resistance, while a logic "0" is characterized by a low resistance.

A typical resistive memory device is an anti-fuse memory device. An anti-fuse memory device, as the name implies, functions in an opposite manner than a fuse. An anti-fuse device normally has a very high resistance, typically an open circuit, unless and until a voltage is applied to the device. When a sufficient voltage is applied to an anti-fuse memory device, the resistance of the device is reduced to a very low resistance, typically a short circuit. Like a blown fuse, once an anti-fuse memory device is shorted, it is typically impossible or impractical to cause it to open again. Therefore, anti-fuse memory devices are typically referred to as a write-once memory devices.

Resistive memory devices are typically arranged in a memory array. A typical resistive memory array is formed by a plurality of conductive traces arranged in rows and columns. The conductive traces extending along the rows of the array are generally referred to as "word lines" and the conductive traces extending along the columns of the array are generally referred to as "bit lines." The word lines and bit lines are typically oriented in an orthogonal relationship to each other. A resistive memory device is formed at each intersection of a word line and a bit line. Each of the resistance memory devices in the array is capable of assuming one of two distinct resistance states, which are used to store information. Data is written into a device in the array by applying a voltage across the device.

Resistive memory devices are typically formed using integrated circuit processing techniques employing various combinations of material depositions, shape definitions using photolithography, and material removal (etches), as known to persons skilled in the art. As noted above, arrays of resistive memory devices are typically formed by arranging a plurality of generally parallel word lines in a generally orthogonal relationship with a plurality of generally parallel bit lines. Each of the word lines is of a generally uniform width, and is separated from the other word lines by a distance that is typically equal to the width of a single word line. Likewise, each of the bit lines is of a generally uniform width, and is separated from the other bit lines by a distance that is typically equal to the width of a single bit line. Arrays are typically symmetrical, and the bits lines and word lines are typically configured to have generally uniform widths.

The word lines are typically formed by depositing a layer of a metal conductor material, followed by a photolithography step to define the width of the lines and the distances between the conductors, followed by an etch step to remove the conductor material from the spaces between the lines. The bit lines are typically formed in the same fashion, and then are disposed orthogonally to the word lines. Since a resistive memory device, such as an anti-fuse, is formed at each intersection of a word line and a bit line, it is desirable to configure the widths of the word lines and bit lines as narrowly as possible to increase the density of resistive memory devices in an array.

Unfortunately, the size of each of the resistive memory devices in such an array is limited by the minimum width of the conductive traces (word lines and bit lines) which form the memory devices. The width of the conductive traces is limited by the capability of the photolithography technology used to form the conductive trace. Therefore, the density of the array (i.e., the number of resistive memory devices in an array of a given size) is also limited by the width of the conductive traces used to form the array.

SUMMARY

An exemplar resistive memory element comprises a first conductive structure and a second conductive structure, each of the conductive structures having a width of less than $1\lambda$, anti-fuse material on each conductive structure, and conductive material on the anti-fuse material such that anti-fuse material is interposed between each conductive structure and the conductive material.

An exemplar method for making a resistive memory element includes providing a generally plateau-shaped insulating structure, the insulating structure having a first side wall, a second side wall and a central region disposed between the side walls, depositing a first conductive material on the insulating structure, removing the first conductive material from the central region of the insulating structure to form a first conductor on the first side wall of the insulating structure and a second conductor on the second side wall of the insulating structure, depositing anti-fuse material on the first conductive material and on the central region of the insulating structure, and depositing a second conductive material on the anti-fuse material.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

DETAILED DESCRIPTION

In the following detailed description, reference is made to the accompanying drawings which form a part hereof, and in which are shown by way of illustration specific embodiments in which the invention may be practiced. It is to be understood that other embodiments may be utilized and structural or process changes may be made without departing from the scope of the present invention. The following detailed description, therefore, is not to be taken in a limiting sense, and the scope of the present invention is defined by the appended claims.

Figure 1:
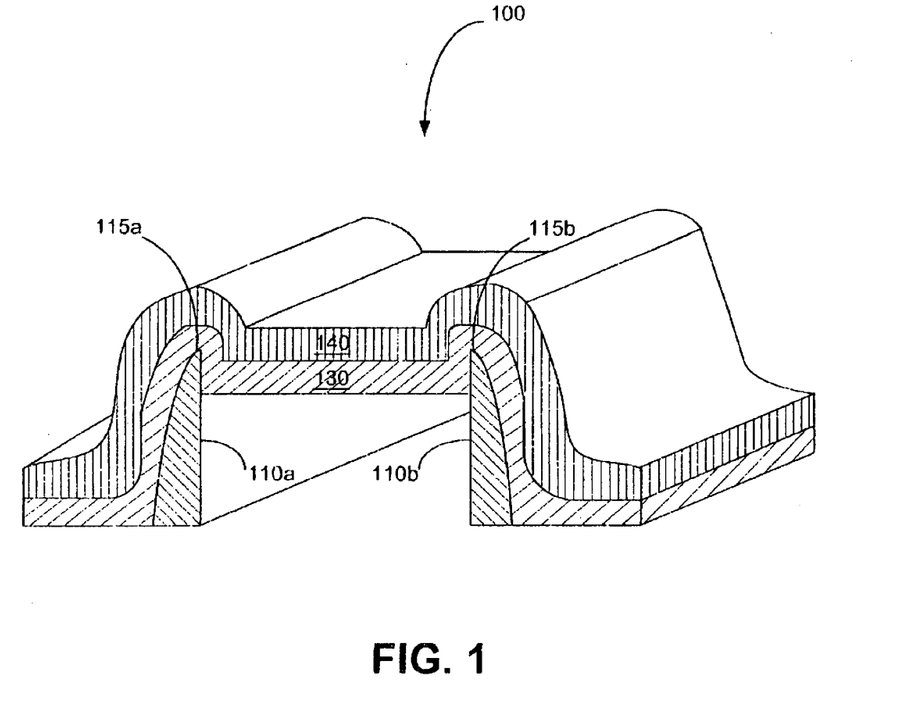
FIG. 1 is a cross-sectional perspective view of a first embodiment of a resistive memory device.

Referring now to the figures, wherein like reference numerals indicate corresponding components throughout the several views, FIG. 1 is a cross-sectional schematic view of a first embodiment of a resistive memory device 100. In this embodiment, the memory device 100 is an anti-fuse type resistive memory device. The memory device 100 is comprised of two conductors 110a and 110b formed by side wall processing, as discussed below with reference to FIGS. 2A through 2D, an anti-fuse material 130 disposed on the two conductors 110a and 110b, and a conductive material 140 disposed on the anti-fuse material 130. Two resistive memory elements 115a and 115b are formed in memory device 100 in the anti-fuse material 130 between conductive material 140 and each of the conductors 110a and 110b. Illustratively, conductors 110a and 110b and conductive material 140 may be comprised of aluminum, doped polysilicon, copper, or another appropriate conductor for forming a resistive memory element. Examples of the anti-fuse material 130 include, but are not limited to, doped amorphous or polysilicon material including a thin silicon dioxide or alumina insulator/junction material.

Each of the conductors 110a and 110b preferably has the configuration depicted in FIG. 1, which is referred to hereinafter as a "bat ear" shaped structure. The sharp edges of the bat ear shaped structures of conductors 110a and 110b, denoted in FIG. 1 as elements 115a and 115b, respectively, form high field point anti-fuses.

The anti-fuses 115a and 115b are normally open circuits. Data may be written to the memory device 100 by applying an appropriate voltage across conductor 140 and either or both of the conductors 110a and 110b. When an appropriate voltage is applied across conductive material 140 and conductor 110a, the anti-fuse 115a will break down and become a short circuit (low resistance). Likewise, when an appropriate voltage is applied across conductive material 140 and conductor 110b, the anti-fuse 115b will break down and become a short circuit (low resistance).

Figure 2A:
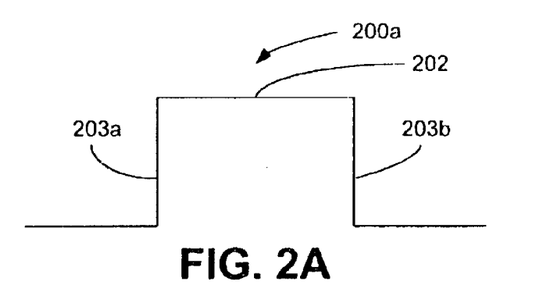
FIGS. 2A through 2D are cross-sectional schematic views collectively illustrating embodiments of the component structures of the resistive memory device of FIG. 1.

FIGS. 2A through 2D are cross-sectional schematic views collectively illustrating embodiments of the component structures of the high density resistive memory device of FIG. 1. Hatching has been omitted from FIGS. 2A through 2D to better illustrate the component structures. With reference to FIG. 2A, a generally plateau-shaped structure 200a comprised of an insulating material is provided, using photolithography techniques. Structure 200a has two side walls 203a and 203b and a central region 202 disposed between the two side walls 203a and 203b. Structure 200a may be formed by known processes, such as, but not limited to, a timed anisotropic vertical etch of a single insulating material, or by providing a first insulating material having a uniform distribution and then selectively depositing a second insulating material on the first layer in the location of the central region 202. Regardless of the specific process used, structure 200a is formed so that its side walls 203a and 203b have a very steep slope, preferably as close to perpendicular to the central region 202 as possible.

Typically, memory device 100 is configured in an array of such memory devices. As noted above, arrays of resistive memory elements are typically formed by arranging a plurality of generally parallel word lines in a generally orthogonal relationship with a plurality of generally parallel bit lines. Each of the word lines is of a generally uniform width, and is separated from the other word lines by a distance that is typically equal to the width of a single word sine. Likewise, each of the bit lines is of a generally uniform width, and is separated from the other bit sines by a distance that is typically equal to the width of a single bit line. Arrays are typically symmetrical, and the bits lines and word lines are typically configured to have generally uniform widths.

It is therefore generally desirable to configure the width of the central region 202 of structure 200a to be the minimum line width allowed by the chosen photolithography technique in order to minimize the size of memory element 100. The minimum line width of a photolithography feature that can be printed is referred to by persons skilled in the art as "1λ".

Using current photolithographic technology, the value of 1λ is on the order of 0.18 μm. As photolithography techniques improve, narrower minimum line widths may be achieved. By configuring central region 202 at a line width of 1λ, the density of an array formed by memory device 100 and other like memory devices may be maximized. Although it is preferable to configure central region 202 at a line width of approximately 1λ in order to maximize the density of an array, the width of central region 202 is not a limiting factor with respect to the present application and the techniques described herein can also be used with line widths greater than 1λ.

Figure 2B:
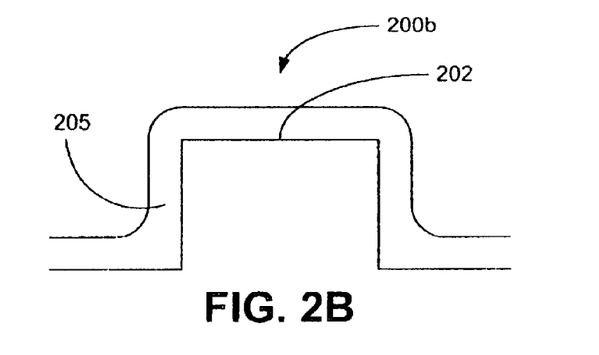

Once structure 200a is formed, a deposition of conductive material 205 is made on the structure 200a to form the structure 200b, as illustrated in FIG. 2B. Conductive material 205 may be any appropriate conductor or semiconductor, including but not limited to polysilicon. Conductive material 205 is deposited conformally on all surfaces of the structure 200a to form structure 200b. The deposition rate at which the conductive material 205 is deposited is chosen so that the thickness of conductive material 205 on all surfaces of the structure 200a is approximately uniform. However, strict uniformity is not required.

Figure 2C:
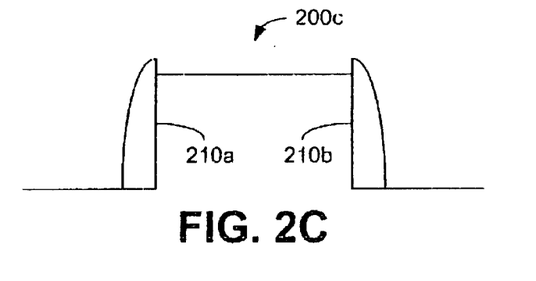

With reference to FIG. 2C, the structure 200b of FIG. 2B is subjected to a vertical anisotropic etch until the conductive material 205 is selectively removed, leaving the structure 200c, which is comprised of conductors 210a and 210b. Conductors 210a and 210b are, therefore, formed at the side walls 203a and 203b of structure 200a of FIGS. 2A and 2B, and the process of forming these conductors is referred to hereinafter as "side wall processing."

Side wall processing, as described herein, is a sublithography process which allows narrower line widths to be achieved than with conventional photolithography techniques. Thus, if central region 202 of structure 200a is produced as optimally as possible to the minimum line width achievable through photolithography (1λ), the two separate conductors 210a and 210b will be separated by a distance of 1λ. However, side wall processing allows the width of each of the conductors 210a and 210b to be less than the minimum 1λ conductor width achievable using conventional photolithography techniques.

Thus, the process of side wall processing described with respect to FIGS. 2A through 2C allows the number of conductors achievable for a given line width to be increased. As discussed below with respect to FIG. 4 and FIGS. 8 through 11, the use of side wall processing allows the density of a resistive memory array to be increased dramatically.

Figure 2D:
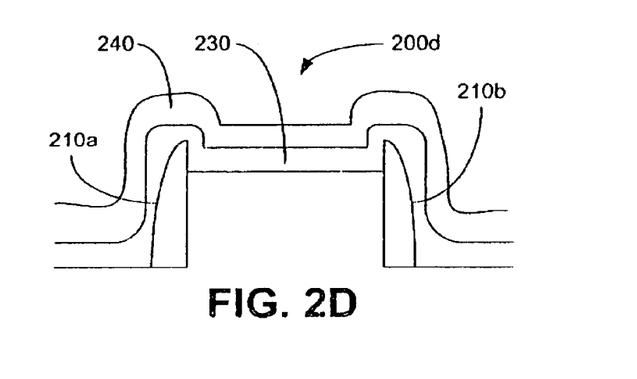

Finally, as illustrated in FIG. 2D, the resistive memory device 100 of FIG. 1 (which corresponds to the structure 200d) is formed. First, an anti-fuse material 230, such as, but not limited to, silicon dioxide or alumina, is deposited conformally on the structure 200c of FIG. 2C. Then, a conductive material 240, such as, but not limited to, aluminum or copper, is deposited conformally on the anti-fuse material 230. Finally, the structure 200d is formed by selective photolithographic etching. Preferably, the conductive material 240 comprises a different conductive material than conductors 210a and 210b so that the conductive material 240 may be selectively etched without affecting the configuration of conductors 210a and 210b. For example, the conductive material 240 could be aluminum and the conductors 210a and 210b could be polysilicon.

Figure 3:
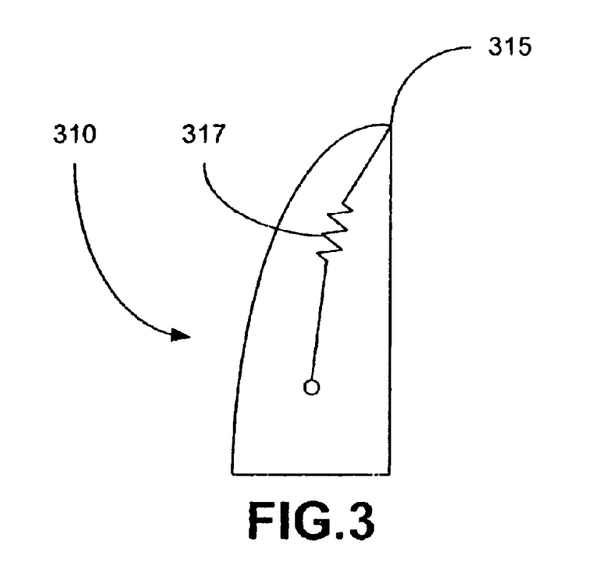
FIG. 3 is a schematic diagram of an embodiment of one of the side wall conductors of FIG. 1.

FIG. 3 is a schematic diagram of an embodiment of a side wall conductor 310 formed by the process discussed with respect to FIGS. 2A through 2D. As discussed above, the use of side wall processing to form the side wall conductor 310 allows two conductors to be formed from a single line width of material, thereby allowing the density of resistive memory devices in an array to be increased. In addition, the bat ear configuration of the side wall conductor 310 creates a high electric field breakdown region 315 at the tip of the bat ear. This is in contrast to a conductor structure having a more planar configuration, wherein it is difficult to isolate a high electric field breakdown region to a specific location on the structure.

For an anti-fuse memory device, it is desirable to have a relatively high series resistance and a relatively low lateral resistance. The high electric field breakdown region 315 of side wall conductor 310 has a series resistance element 317. The value of the series resistance element 317 is proportional to the width of side wall conductor 310 in the vicinity of the high electric field breakdown region 315. Because of this relationship, the cross-section of side wall conductor 310 can be configured using the process described above to set the series resistance 317. Similarly, the lateral resistance of side wall conductor 310 is proportional to its cross-sectional area, which can also be configured as desired using the process described above.

Figure 4:
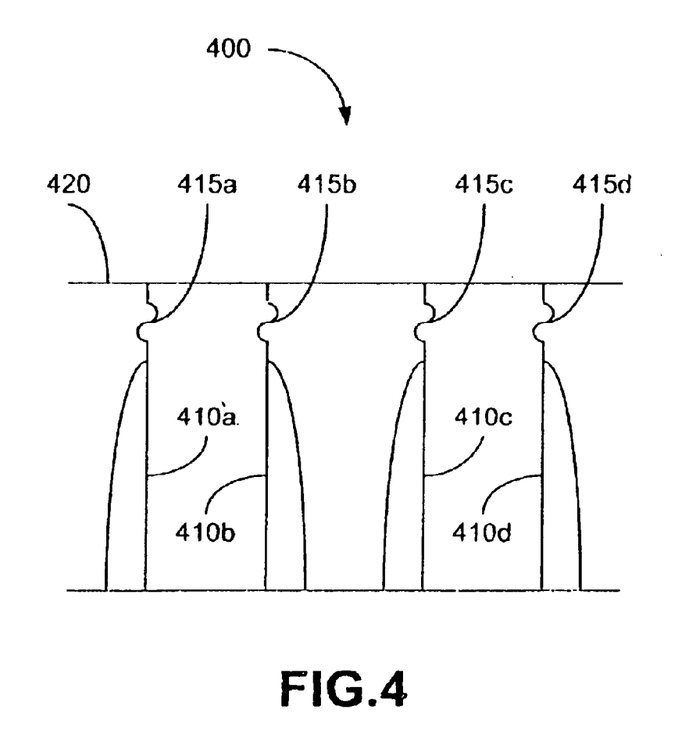
FIG. 4 is a schematic diagram of a memory array comprised of a plurality of the resistive memory devices of FIG. 1.

FIG. 4 is a schematic diagram of a memory array 400 comprised of two of the high density resistive memory elements 100 of FIG. 1. With reference to FIG. 4, four conductors 410a, 410b, 410c and 410d formed according to the side wall processing technique described above with respect to FIGS. 2A through 2D are each connected to a common conductor 420 through resistive memory elements 415a, 415b, 415c and 415d, respectively. Resistive memory elements 415a, 415b, 415c and 415d are illustratively anti-fuses. The conductors 410a through 410d are shown in cross-section. Illustratively, conductor 420 is a word line of the array 400 and each of the four conductors 410a through 410d is a bit line of the array 400. However, conductor 420 can alternatively be viewed as a bit line and each of the four conductors 410a through 410d can be viewed as a word line of array 400.

Thus, a resistive memory array which utilizes side wall processing on either the word lines or the bit lines (but not on both the word lines and the bit lines) can increase the number of resistive memory devices in a given area up to double the number that can be achieved using conventional photolithography techniques. If side wall processing is used on both the word lines and the bit lines, as described below with reference to FIGS. 8 through 12, the number of word lines and the number of bit lines in a given area can both be doubled. Thus, the total number of resistive memory devices achievable in a given area can be increased up to four times the number otherwise achievable using conventional photolithography techniques.

The side wall conductors 110a and 110b of the resistive memory device 100 of FIG. 1 are comprised of a single conductive structure. However, it may be desirable to use side wall processing to form resistive memory devices having multiple distinct side wall structures, as described below with respect to FIGS. 5, 6 and 7. For example, it may be desirable to form an isolation element, such as a diode, in series with an anti-fuse or other resistive memory element in order to isolate a selected memory element from the effects of other, unselected memory elements in an array.

Figure 5:
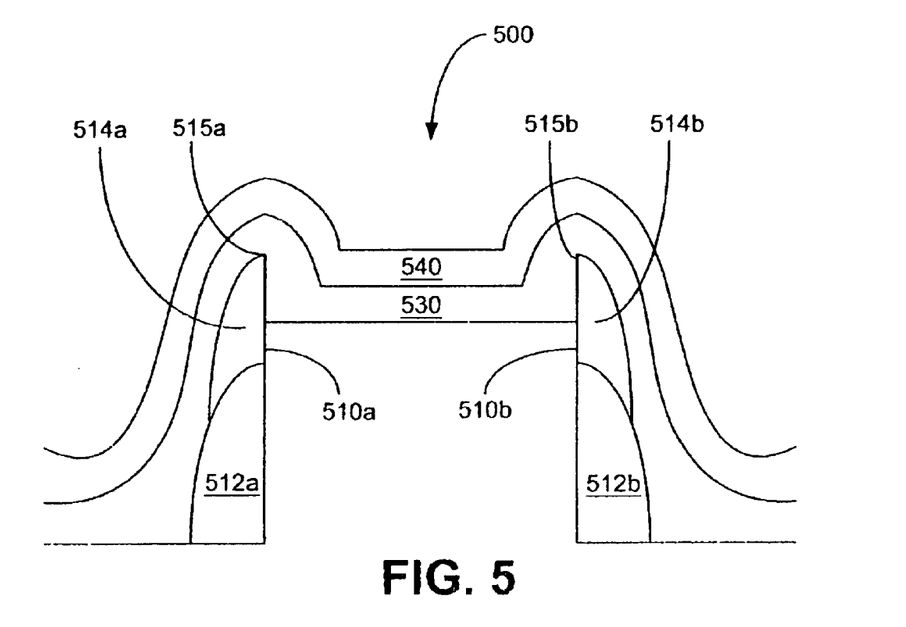
FIG. 5 is a cross-sectional view of a second embodiment of a resistive memory device.

FIG. 5 is a cross-sectional view of a second embodiment of a high density resistive memory device 500. Hatching has been omitted from FIG. 5 to better illustrate the device. Memory device 500 is generally configured in the same way as memory device 100 of FIG. 1. Like memory device 100 of FIG. 1, memory device 500 is comprised of two side wall conductive structures 510a and 510b, an anti-fuse material 530 disposed on the conductive structures 510a and 510b, and a conductive material 540 disposed on the anti-fuse material 530. Each of the side wall structures 510a and 510b has the bat ear configuration depicted in FIG. 5. The sharp tips of the bat ear shaped structures 510a and 510b, denoted in FIG. 5 as elements 515a and 515b, respectively, form high electric field points.

The memory device 500 of FIG. 5 differs from the memory device 100 of FIG. 1 in that, unlike the monolithic side wall structures 110a and 110b of FIG. 1, the side wall structures 510a and 510b of device 500 comprise two distinct structures 512a and 514a, and 512b and 514b, respectively. These distinct structures are constructed by multiple deposition and etch steps, as described hereinafter with respect to FIG. 7.

Structures 512a and 512b are conductors comprised of polysilicon or a metal conductor analogous to the conductors 110a and 110b of FIG. 1. Structures 514a and 514b are comprised of a different material, such as doped polysilicon, so that a diode such as a Schottky diode, is formed at the intersection of structures 512a and 514a, and at the intersection of structures 512b and 514b. These diodes are illustrated in FIG. 6 as elements 521a and 521b at the junction of structures 512a and 514a, and 512b and 514b, respectively.

Figure 6:
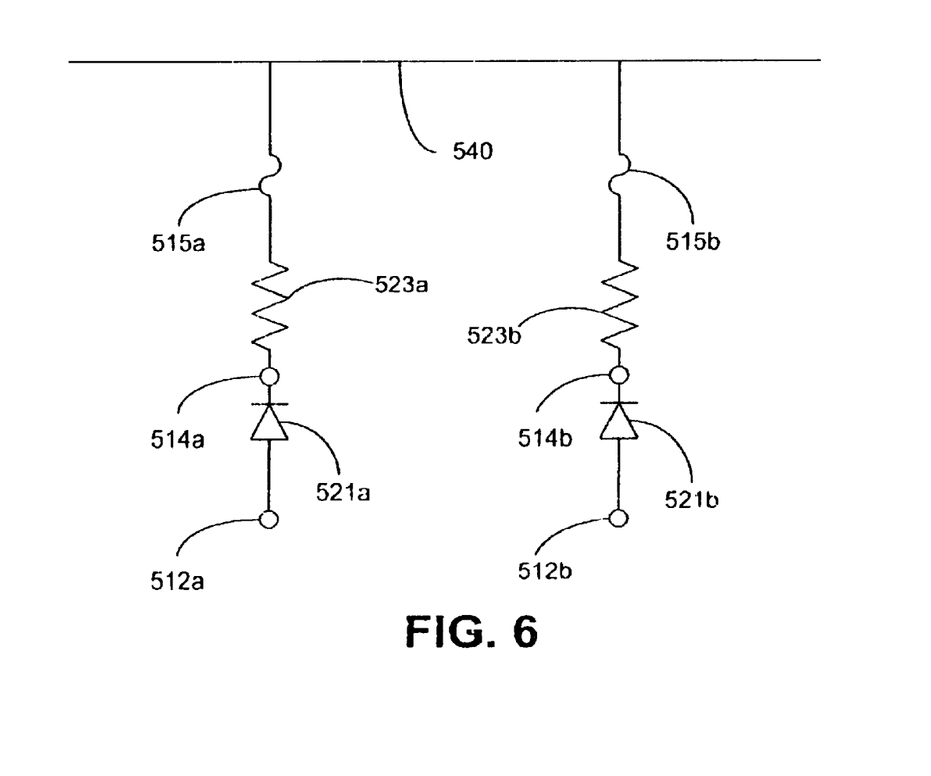
FIG. 6 is a schematic illustration of the electronic components formed by the structure of the resistive memory device of FIG. 5.

FIG. 6 is a schematic illustration of the electronic components formed by the structure of memory device 500. Anti-fuses 515a and 515b are formed in the anti-fuse material 530 between the tips of structures 514a and 514b and the conductive material 540. Diodes 521a and 521b are formed within structures 510a and 515b at the intersection of structures 512a and 514a, and at the intersection of structures 512b and 514b, respectively. As noted above, when memory device 500 forms part of a memory array, diodes 521a and 521b serve to isolate the anti-fuses 515a and 515b from other memory elements in the array.

Additional electronic components may also be achieved by the physical structure illustrated in FIG. 5 through selection of appropriate materials to form structures 512a, 512b, 514a and 514b. For example, if structures 512a and 512b are formed from a low resistance conductor and structures 514a and 514b are formed from a higher resistance conductor, series resistor elements 523a and 523b may be formed in series with the anti-fuse elements 515a and 515b, respectively. Such a configuration is desirable to control the resistance of memory elements in which the anti-fuses have previously been programmed (i.e., anti-fuses that have previously been written (shorted)).

Figure 7:
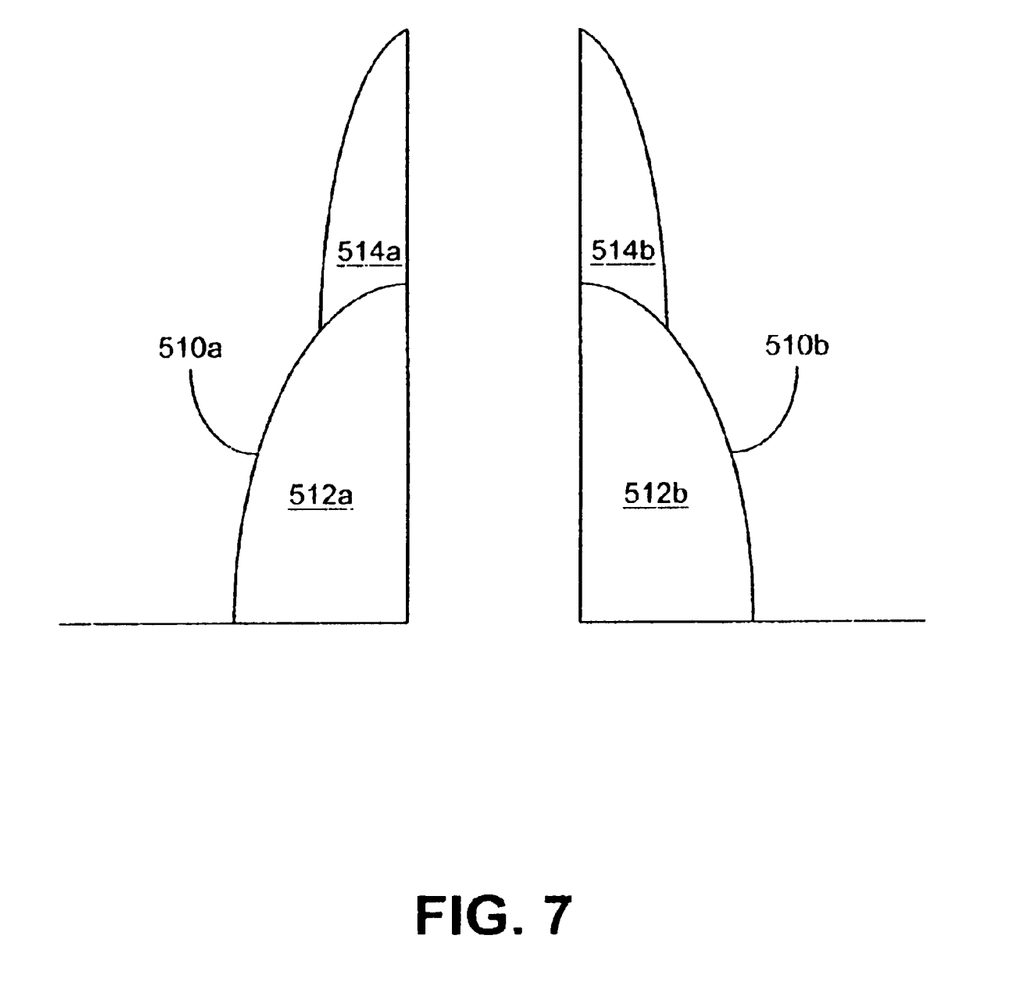
FIG. 7 is a cross-sectional view of the side wall structures of FIG. 5.

FIG. 7 is a cross-sectional view of the side wall structures 510a and 510b of FIG. 5, which are comprised of structures 512a and 514a, and structures 512b and 5141b, respectively. Hatching has been omitted from FIG. 7 to better illustrate the structures. These structures are formed by a process that is generally analogous to the process described above with respect to FIGS. 2A through 2D. Structures 512a and 512b are formed by conformally depositing a high conductivity material, such as a metal or a semiconductor material, on an insulating structure configured similarly to the insulating structure 200a of FIG. 2A. Then, the high conductivity material and the insulating support structure are etched with an anisotropic vertical etch to form two low resistance conductors along the side walls (i.e., structures 512a and 512b). The etch is performed so that the structures 512a and 512b have the bat ear configuration shown in FIG. 7.

After structures 512a and 512b have been formed, a different conductive material is disposed on structures 512a and 512b to form structures 514a and 514b. For example, structures 512a and 512b could be formed with p-doped amorphous silicon and structures 514a and 514b could be formed with n-doped amorphous silicon. This results in the formation of p-n junction diodes at the intersection of structures 512a and 514a, and at the intersection of structures 512b and 514b. Other materials can also be chosen to produce desired features. After the different conductive material has been conformally deposited, a second anisotropic vertical etch is performed to shape structures 514a and 514b into the bat ear configuration shown in FIG. 7.

After structures 512a, 512b, 514a and 514b are formed, as described with respect to FIG. 7, the following steps are performed to form the memory device 500 of FIG. 5. With reference to FIG. 5, a selective etch is performed to expose the tips 515a and 515b of structures 514a and 514b, respectively (i.e., the high electric field breakdown region of each structure). Then, an anti-fuse material is conformally deposited on the entire structure to form anti-fuse layer 530, and a high conductivity layer 540 is conformally deposited on the anti-fuse layer 530. Finally, the device 500 is completed by selective photolithographic etching. Although not shown in FIG. 5, it may be desirable to conformally deposit an interface material between the anti-fuse material 530 and the high conductivity material 540 to keep the anti-fuse material 530 from mixing with the high conductivity material 540 during the etch step. However, this interface material will be removed as part of the etch, resulting in the structures illustrated in FIG. 7.

Figure 10:
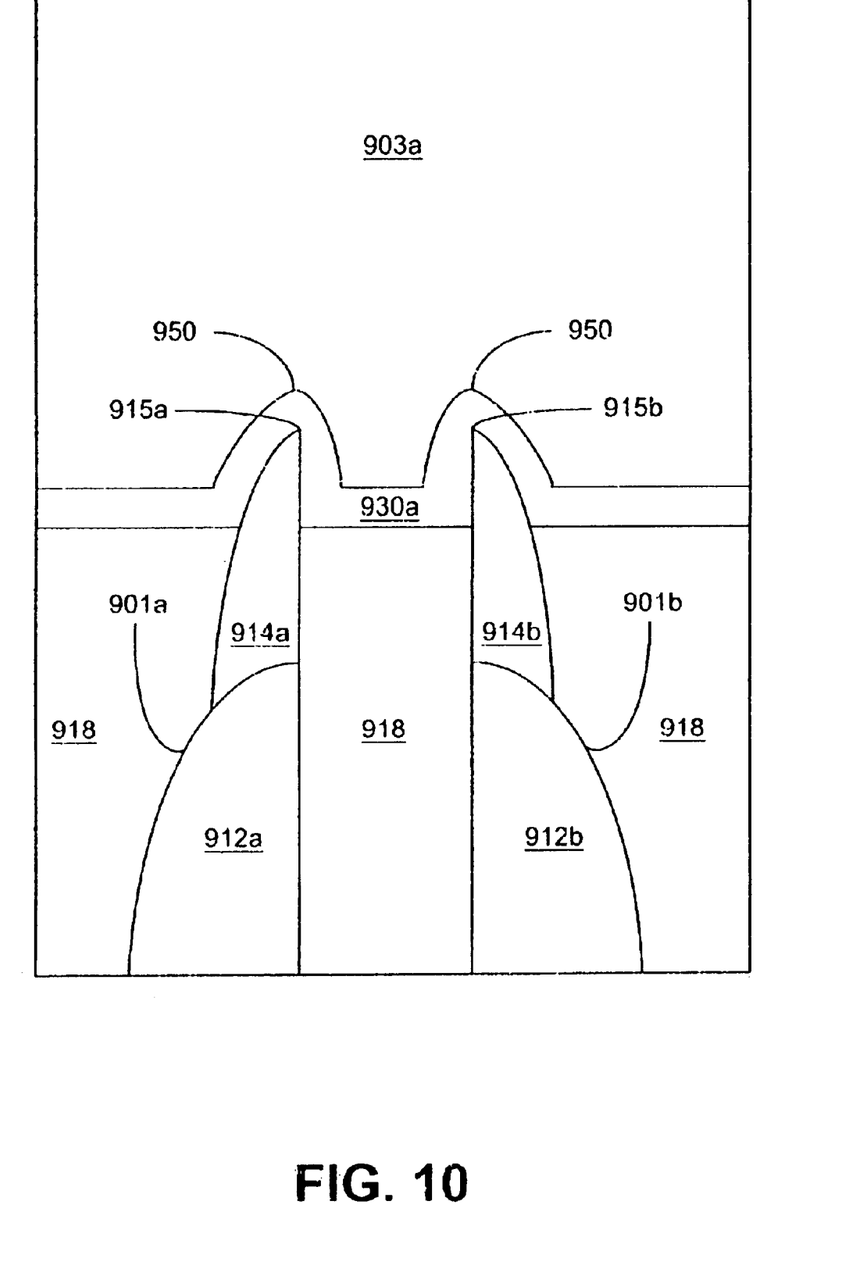
FIGS. 10 and 11 are cross-sectional views collectively illustrating an embodiment of the component structures of the resistive memory array of FIG. 9.
Figure 11:
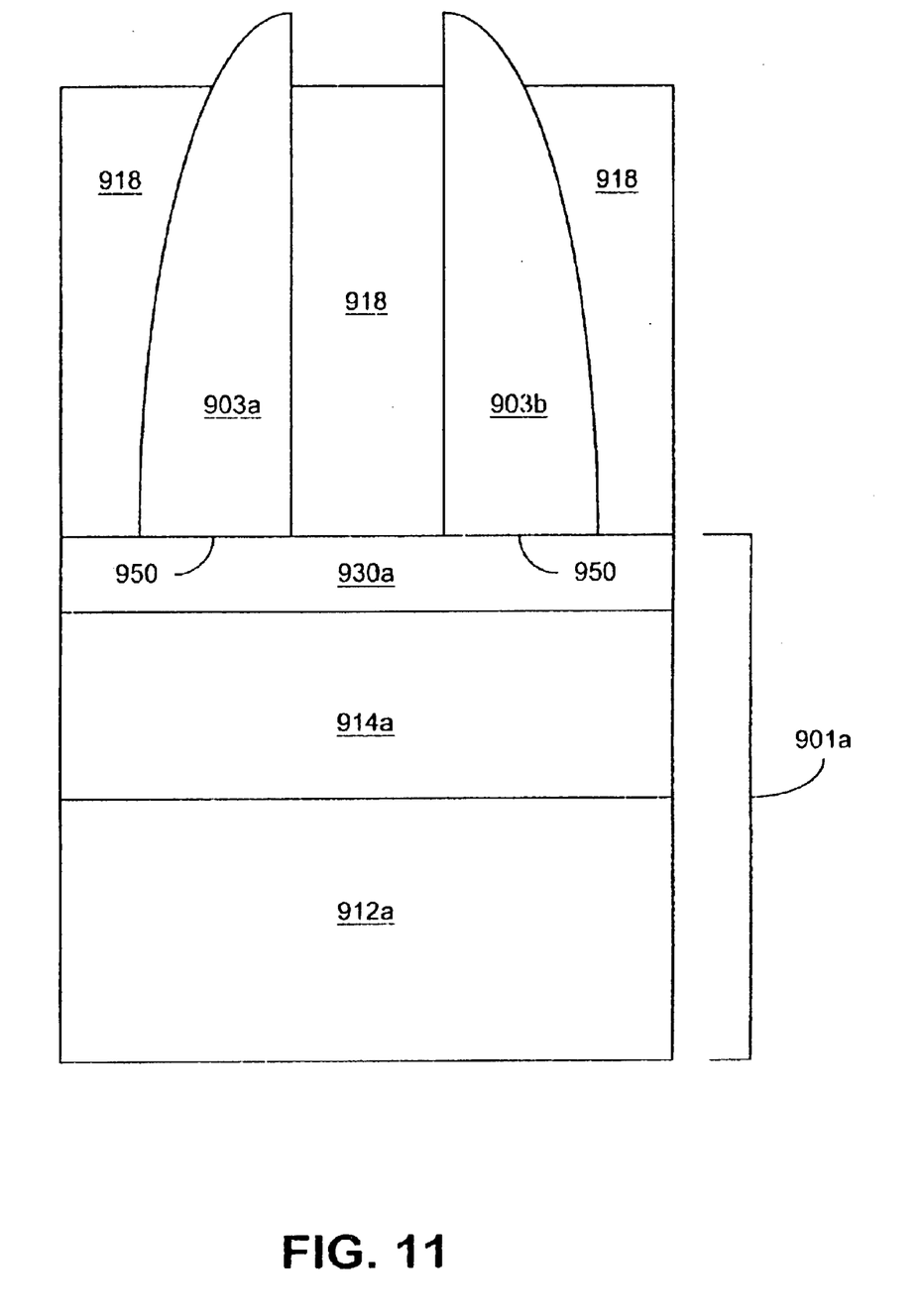
Figure 12:
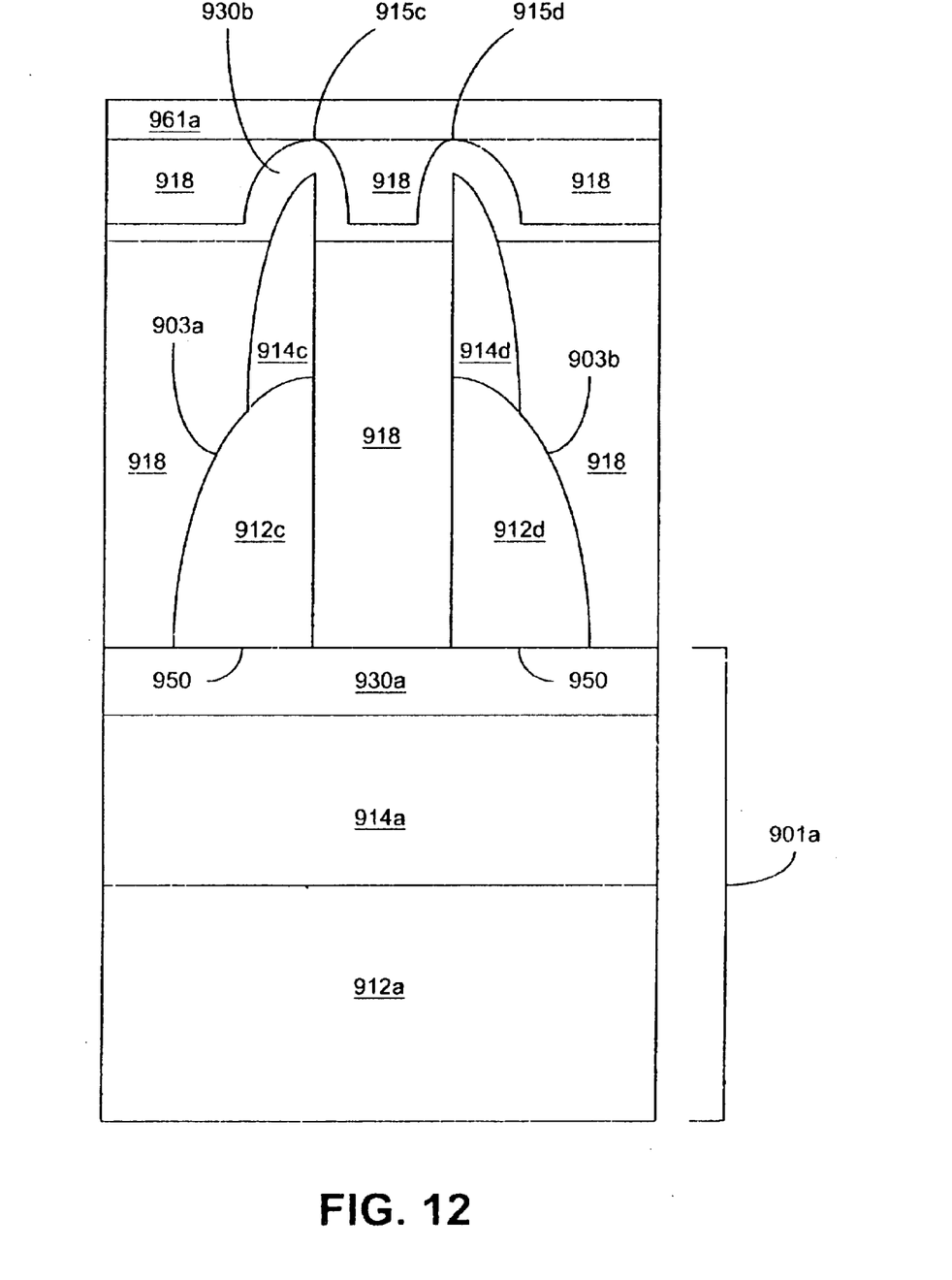
FIG. 12 is a cross-sectional view of another embodiment of the resistive memory array of FIG. 9.
Figure 13:
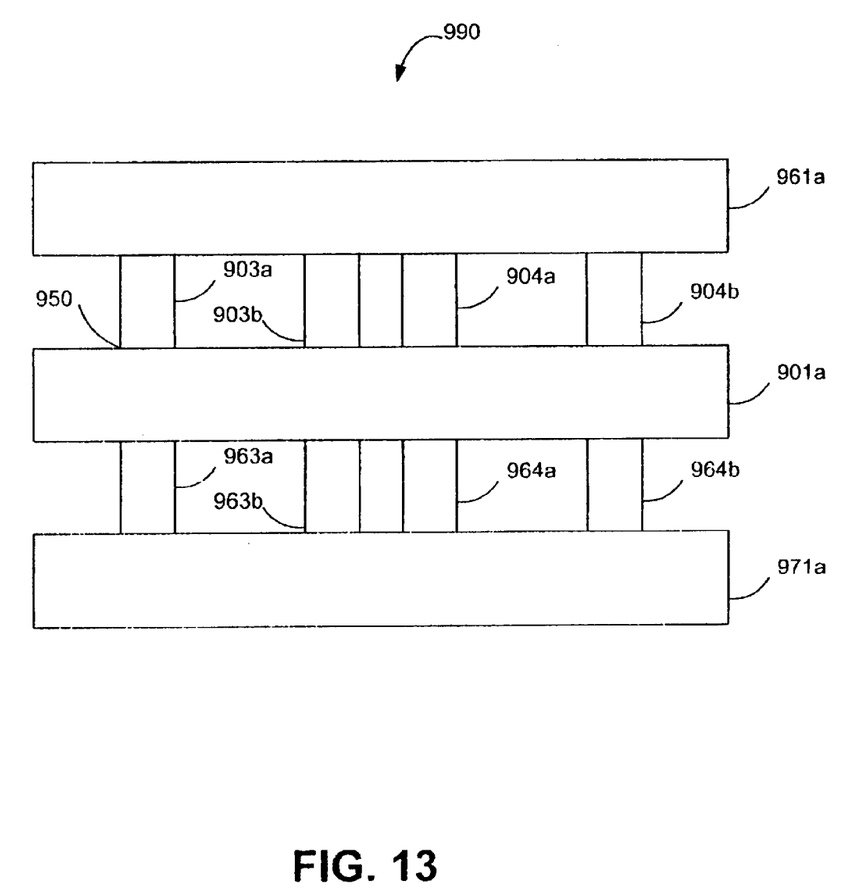
FIG. 13 is a side view of a stacked memory array in which the word lines and the bit lines are configured according to the embodiment of FIG. 12.

FIGS. 8 through 12 collectively illustrate how side wall processing may be applied to both the word lines and the bit lines of a resistive memory array to increase the density of the array up to four times the density of an array formed using photolithographic processes alone. FIGS. 12 and 13 also illustrate how side wall processing may be used in making a multi-tiered memory array.

Figure 8:
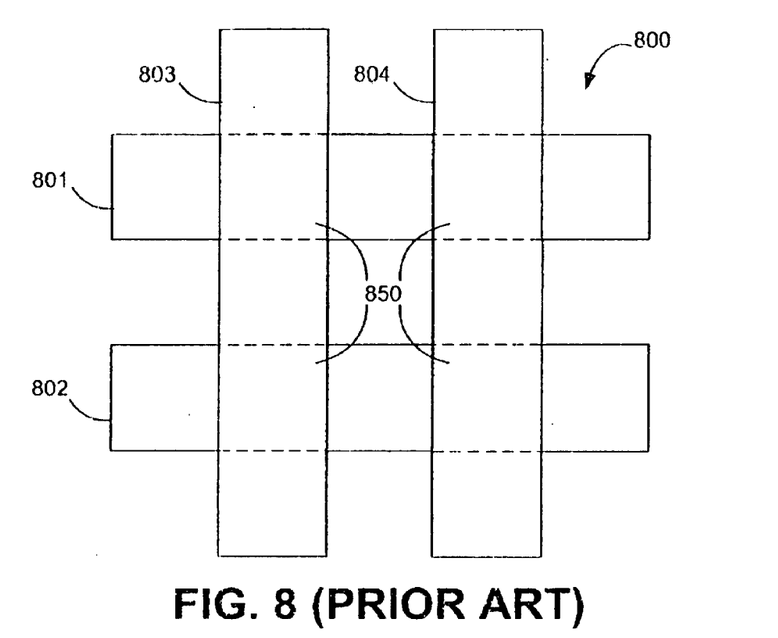
FIG. 8 is a top view of a portion of a prior art resistive memory array.
Figure 9:
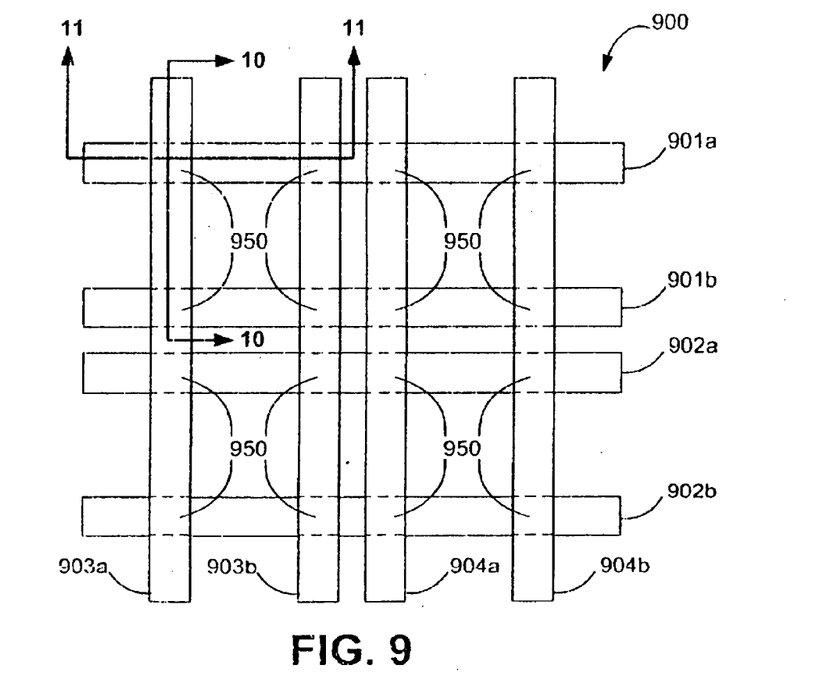
FIG. 9 is a top view of a first embodiment of a portion of a resistive memory array in which the conductors are formed by side wall processing.

FIGS. 8 and 9 are drawn to scale relative to each other to illustrate the increased density that may be achieved by side wall processing. FIG. 8 is a top view of a prior art resistive memory array 800 having word lines 801 and 802 and bit lines 803 and 804. Although two word lines and two bit lines are shown for simplicity, a typical array will have a large plurality of word lines and bit lines. A resistive memory element 850 is formed at each intersection of one of the word lines 801 and 802 with one of the bit lines 803 and 804. If the array 800 is a typical symmetrical array formed by optimal photolithographic techniques, the word lines 801 and 802 and the bit lines 803 and 804 will each have a width of approximately 1λ. Likewise, word line 801 will be separated from word line 802 and bit line 803 will be separated from bit line 804 by a distance of approximately 1λ. Thus, the total width of the array 800 is approximately 5λ, the total height of the array 800 is 5λ, and the area of the array 800 is 25λ².

FIG. 9 is a top view of a resistive memory array 900 having word lines 901a, 901b, 902a and 902b, and bit lines 903a, 903b, 904a and 904b. By utilizing side wall processing, a pair of separate word lines (e.g., word lines 901a and 901b) can be formed in approximately the same space as a single word line (e.g., word line 801) of FIG. 8. Likewise, side wall processing allows a pair of separate bit lines (e.g, bit lines 903a and 903b) to be formed in approximately the same space as a single bit line (e.g., bit line 803) of FIG. 8. Each pair of separate word lines and each pair of separate bit lines are formed using the side wall processing process discussed with respect to FIGS. 2A through 2D.

Like array 800 of FIG. 8, the total width of array 900 is approximately 5λ, the total height of array 900 is approximately 5λ, and the area of array 900 is approximately 25λ². However, unlike the uniform spacing of the word lines and bit lines in array 800, due to the side wall processing used to form the word lines and bit lines of array 900, the word lines and bit lines are spaced in the pattern shown in FIG. 9. Thus, the space between each pair of separate word lines (i.e., word lines 901a and 901b, and word lines 902a and 902b) is 1λ, and the space between each pair of separate bit lines (i.e., bit lines 903a and 903b, and bit lines 904a and 904b) is likewise 1λ. However, the space between each conductor of a single conductor pair (e.g., word line 901b) and the adjacent conductor of the next conductor pair (e.g., word line 902a) is less than 1λ due to the width of the conductors formed by the side wall processing. However, the combined width of such conductors (e.g., word line 901b and 902a) and the space between them is approximately 1λ, as illustrated in FIG. 9. Due to the configuration that results from side wall processing, it is necessary that each of the conductors has a width of less than ½λ so that sufficient space can be maintained between word lines 901b and 902a and between bit lines 903b and 904a.

A resistive memory element 950 is formed at each intersection of a word line and a bit line. Thus, as illustrated in FIG. 9, by utilizing side wall processing to form both the word lines and bit lines, sixteen (16) resistive memory elements 950 may be formed in approximately the same area as the four (4) resistive memory elements 850 of FIG. 8.

FIGS. 10 and 11 are cross-sectional views of an embodiment of a portion of memory array 900 of FIG. 9. Hatching has been omitted from FIGS. 10 and 11 to better illustrate the component structures of the array. In FIG. 10, the embodiment is viewed from the perspective of view line 10—10 of FIG. 9. As illustrated in FIG. 10, word line 901a comprises structures 912a and 914a. Likewise, word line 901b comprises structures 912b and 914b. Anti-fuse layer 930a is disposed on word lines 901a and 901b. The sharp tips of the bat ear shaped structures of word lines 901a and 901b, denoted in FIG. 10 as elements 915a and 915b, respectively, form high electric field points. The features of FIG. 10 are constructed using processes such as the processes described above with respect to FIGS. 5, 6 and 7, and are analogous to features 510a and 510b, 512a and 512b, 514a and 514b, 515a and 515b, and 530 of FIG. 5, respectively.

However, instead of the top conductor 540 of FIG. 5, the top conductor of the structure illustrated in FIG. 10 is bit line 903a of FIG. 9. A resistive memory element 950 is formed in anti-fuse material 930a at the intersection of the high electric field point area 915a of word line 901a and bit line 903a. Likewise, a resistive memory element 950 is formed at the intersection of the high electric field point area 915b of word line 901b and bit line 903a.

FIG. 11 is a cross-sectional view of the same embodiment of memory 900 of FIG. 9 as depicted in FIG. 10. However, in FIG. 11 the view is from the perspective of view lines 11—11 of FIG. 9. As illustrated in FIG. 11, bit lines 903a and 903b are constructed using processes such as the processes described above with respect to FIGS. 5, 6 and 7, and are analogous to features 510a and 510b of FIG. 5.

Features 912a, 914a and 930a of FIG. 11 are part of the structure of word line 901a of FIG. 9, which is constructed as illustrated in detail in FIG. 10. With respect to FIG. 11, a resistive memory element 950 is formed in anti-fuse material 930a at the intersection of conductor element 914a of word line 901a and bit line 903a, and at the intersection of conductor element 914a of word line 901a and bit line 903b.

In addition to the features discussed above, as illustrated in FIGS. 10 and 11, a dielectric 918 may be disposed into the areas between each of the word lines 901a and 901b and in the areas between each of the bit lines 903a and 903b. It also may be advantageous to dispose the dielectric 918 into the areas between each of the word lines and bit lines depicted in FIGS. 10 through 12 and the adjacent word lines and bit lines in the array (not shown). The dielectric 918 may be disposed by various techniques, including various combinations of chemical-mechanical polish (CMP) and selective etching. The result of filling the areas between each of the word lines and each of the bit lines with a dielectric 918 gives each word line and each bit line a planar or nearly planar upper and lower surface, which facilitates the stacking of the word lines and bit lines to produce a multi-tiered memory array, as discussed below with respect to FIGS. 12 and 13.

FIG. 12 is a cross-sectional view of another embodiment of memory array 900 of FIG. 9, viewed from the perspective of view line 11—11. Hatching has been omitted from FIG. 12 to better illustrate the component structures of the array. In this embodiment, the bit lines 903a and 903b have been further configured so that they can be embedded in a multi-tiered memory array wherein additional word lines, illustrated in this view as exemplar word line 961a, could be stacked on top of and in an orthogonal relationship to bit lines 903a and 903b to form additional memory devices.

In the embodiment of FIG. 12, bit line 903a has been configured to include structures 912c and 914c. Likewise, bit line 903b has been configured to include structures 912d and 914d. A anti-fuse layer 930b is disposed over bit lines 903a and 903b. The sharp tips of the bat ear shaped structures 903a and 903b, denoted in FIG. 12 as elements 915c and 915d, respectively, form high electric field points. The features in FIG. 12 are constructed using processes such as the processes described above with respect to FIGS. 5, 6 and 7, and are analogous to features 510a and 510b, 512a and 512b, 514a and 514b, 515a and 515b, and 530 of FIG. 5, respectively. As described above, a dielectric 918 is disposed into the spaces between and around the conductive structures to form more planar surfaces in order to facilitate stacking. However, instead of a discrete top conductor, such as element 540 of FIG. 5, the top conductor of bit lines 903a and 903b is formed by word line 961a, which is stacked on top of bit lines 903a and 903b, as illustrated in FIG. 13. This would allow additional memory devices to be formed at the intersection of each of elements 915c and 915d and word line 961a.

FIG. 13 is a side view of a stacked memory array 990 in which the word lines 901a, 961a and 971a, and the bit lines 903a, 903b, 904a, 904b, 963a, 963b, 964a and 964b are formed as described above with respect to FIG. 12. A resistive memory element 950 is formed at each intersection of a word line and a bit line.

It will be apparent to those skilled in the art that many modifications and variations may be made to the preferred embodiments of the present invention, as set forth above, without departing from the principles of the present invention. For example, additional layers of word lines and bit lines could be configured using side wall processing and stacked to form a dense multi-tiered memory array. All such modifications and variations are intended to be included herein within the scope of the present invention, as defined in the claims that follow.

What is claimed is:

1. A method for constructing a resistive memory element, the method comprising:
   providing a generally plateau-shaped insulating structure, the insulating structure having a first side wall, a second side wall and a central region disposed between the side walls;
   depositing a first conductive material on the insulating structure;
   removing the first conductive material from the central region of the insulating structure to form a first conductor on the first side wall of the insulating structure and a second conductor on the second side wall of the insulating structure;
   depositing anti-fuse material on the first conductive material and on the central region of the insulating structure; and
   depositing a second conductive material on the anti-fuse material.

2. The method of claim 1, wherein the first conductive material and the second conductive material are the same material.

3. The method of claim 1, wherein the first conductive material and the second conductive material are different materials.

4. The method of claim 1, wherein the first conductive material, the anti-fuse material, and the second conductive material are each deposited conformally.

5. The method of claim 1, wherein removing further comprises etching the first conductive material.

6. The method of claim 5, wherein the etching is anisotropic etching.

7. The method of claim 1, further comprising etching the first conductor and the second conductor.

8. The method of claim 7, wherein etching configures each of the conductors into a tapered configuration comprising two ends, one of the ends having a narrow width than the other end.

9. The method of claim 1, wherein each of the conductive structures has a width of less than $1\lambda$.

10. The method of claim 1, wherein the first conductive structure and the second conductive structure are separated from each other by a distance of approximately $1\lambda$.

11. A method for constructing a resistive memory element, the method comprising:

provic a generally plateau-shaped insulating structure, the insulating structure having a first side wall, a second side wall and a central region disposed between the side walls;

depositing a first conductive material on the insulating structure;

removing the conductive material from the central region of the insulating structure to form a first conductor on the first side wall of the insulating structure and a second conductor on the second side wall of the insulating structure;

depositing a second conductive material on the first conductor and the second conductor;

depositing anti-fuse material on the second conductive material and on the central region of the insulating structure; and depositing a third conductive material on the anti-fuse material.

12. The method of claim 11, wherein the resistance of the first conductive material is lower than the resistance of the second conductive material.

13. The method of claim 11, wherein the first conductive material is n-doped silicon and the second conductive material is p-doped silicon.

14. The method of claim 11, wherein the first conductive material, the anti-fuse material, the second conductive material and the third conductive material are each deposited conformally.

15. The method of claim 11, wherein removing further comprises etching the first conductive material.

16. The method of claim 15, wherein the etching is anisotropic etching.

17. The method of claim 11, wherein each of the conductive structures has a width of less than $1\lambda$.

18. The method of claim 11, wherein the first conductive structure and the second conductive structure are separated from each other by a distance of approximately $1\lambda$.

* * * * *